United States Patent
Bender et al.

(10) Patent No.: US 11,042,200 B2
(45) Date of Patent: Jun. 22, 2021

(54) LIQUID SOLUBLE GAS SEALED COOLING SYSTEM

(71) Applicant: Google LLC, Mountain View, CA (US)

(72) Inventors: Shawn Emory Bender, Campbell, CA (US); Jorge Padilla, Union City, CA (US)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 17/082,953

(22) Filed: Oct. 28, 2020

(65) Prior Publication Data
US 2021/0064107 A1  Mar. 4, 2021

Related U.S. Application Data

(63) Continuation of application No. 16/936,254, filed on Jul. 22, 2020, now Pat. No. 10,852,789, which is a continuation of application No. 16/555,831, filed on Aug. 29, 2019, now Pat. No. 10,761,577.

(51) Int. Cl.
*H05K 7/20* (2006.01)
*G06F 1/20* (2006.01)

(52) U.S. Cl.
CPC ............ *G06F 1/20* (2013.01); *H05K 7/202* (2013.01); *H05K 7/20254* (2013.01); *H05K 7/20272* (2013.01); *H05K 7/20781* (2013.01); *H05K 7/20927* (2013.01)

(58) Field of Classification Search
CPC ...... G06F 1/20; H05K 7/202; H05K 7/20254; H05K 7/20272; H05K 7/20781; H05K 7/20927
See application file for complete search history.

(56) References Cited

U.S. PATENT DOCUMENTS

| | | | | |
|---|---|---|---|---|
| 3,406,244 A | | 10/1968 | Sevgin | |
| 5,813,243 A | * | 9/1998 | Johnson | G06F 1/20 361/678 |
| 5,825,621 A | * | 10/1998 | Giannatto | H05K 7/202 361/701 |
| 8,405,975 B2 | | 3/2013 | Heiberg | |
| 2004/0160741 A1 | | 8/2004 | Moss | |
| 2004/0221604 A1 | | 11/2004 | Ota | |

(Continued)

FOREIGN PATENT DOCUMENTS

| | | |
|---|---|---|
| CN | 102510709 | 6/2012 |
| JP | 2011/019339 | 1/2011 |

(Continued)

OTHER PUBLICATIONS

EPO machine translation of Nagaishi JP2016111250A. (Year: 2016).*

(Continued)

*Primary Examiner* — Jacob R Crum
(74) *Attorney, Agent, or Firm* — Fish & Richardson P.C.

(57) ABSTRACT

An apparatus that first and second volumes are fluidly separated by a combination of a first second and a second sections, where the first section is insoluble to a cooling liquid and the second section is soluble to the cooling liquid. In the event of a leak of coolant liquid, the second sections dissolve, forming a fluid path from the first volume to the second volume. The coolant liquid may then escape the first volume in spaces that result from the dissolution of the second sections.

13 Claims, 4 Drawing Sheets

(56) References Cited

U.S. PATENT DOCUMENTS

| | | |
|---|---|---|
| 2005/0052847 A1 | 3/2005 | Hamman |
| 2005/0083656 A1 | 4/2005 | Hamman |
| 2005/0194312 A1 | 9/2005 | Niemeyer et al. |
| 2006/0197241 A1 | 9/2006 | Brenneke |
| 2017/0181323 A1 | 6/2017 | Shelnutt |
| 2017/0181326 A1 | 6/2017 | Shelnutt |
| 2018/0228055 A1* | 8/2018 | Yoshizumi ......... H05K 7/20272 |
| 2019/0166724 A1 | 5/2019 | Moss |
| 2020/0163251 A1 | 5/2020 | Chopra |

FOREIGN PATENT DOCUMENTS

| | | |
|---|---|---|
| JP | 2016/111250 | 6/2016 |
| JP | 2017/123121 | 7/2017 |

OTHER PUBLICATIONS

Kozubal, "Innovation Incubator: LiquidCool Solutions Technical Evaluation, Laboratory Study and Demonstration Results of a Directed-Flow, Liquid Submerged Server for High-Efficiency Data Centers" National Renewable Energy Laboratory, Dec. 2017, 59 pages.

TW Office Action in Taiwan Application No. 109126445, dated Jan. 12, 2021, 6 pages (with English translation).

Extended European Search Report in European Application No. 20191150.0, dated Jan. 18, 2021, 10 pages.

\* cited by examiner

LIQUID SOLUBLE GAS SEALED COOLING SYSTEM

CROSS-REFERENCE TO RELATED APPLICATIONS

This application is a continuation application of, and claims priority to, U.S. patent application Ser. No. 16/936,254, titled "LIQUID SOLUBLE GAS SEALED COOLING SYSTEM," filed on Jul. 22, 2020, which is a continuation application of, and claims priority to, U.S. patent application Ser. No. 16/555,831, now U.S. Pat. No. 10,761,577, titled "LIQUID SOLUBLE GAS SEALED COOLING SYSTEM," filed on Aug. 29, 2019. The disclosure of the foregoing applications are incorporated herein by reference in their entirety for all purposes.

BACKGROUND

Large computer, storage, or networking server systems, typically used in datacenters, require cooling. Often times liquid cooling systems are used to cool these systems. The liquid cooling system is typically a closed loop system that communicates chilled cooling fluid (coolant) to a cooling plate that is thermally coupled to a heat load (e.g., electronics) that requires cooling. The cooling plate transfers heat from the heat load to the coolant, and the heated coolant is communicated to a heat exchange for chilling.

Typically a rack or a chassis that is liquid cooled also includes multiple different airflow domains. An airflow domain, or more generally a gas flow domain, is a volume that is sealed from other gas flow domains and through which a gas (typically air) can be maintained at a positive pressure relative to ambient atmospheric pressure. There are liquid and air cooled equipment that require two or more gas flow domains that are independent and fluidly isolated from each other (e.g., fluidly sealed relative to each other). When a liquid coolant leak occurs in one of the domains, however, the coolant will tend to collect in the domain, as the domain is fluidly sealed from the other domains and from the external atmosphere.

To prevent pooling of coolant, some systems have unsealed airflow domains, typically through an unsealed drain outlet, to allow drainage from the airflow domain having liquid cooling components. This design, however, negatively impacts the air cooling effectiveness the airflow domains that are in communication with the unsealed drain outlet. Another design involves separate drainage paths for each domain. This design is more complex than the prior design, however, and is difficult to scale.

SUMMARY

The technology in this patent application is related to systems and methods for integrating liquid soluble seals/gaskets in air and water cooled electronic equipment to prevent coolant pooling within the volume that defines an air flow domain.

In general, one innovative aspect of the subject matter described in this specification can be embodied in an apparatus including a housing having a drain surface, and having defined within: a first volume, and a second volume that is fluidly isolated from the first volume by a separating member, wherein the separating member includes a first section that is insoluble to a cooling liquid and one or more second sections, wherein each of the one or more second sections is soluble to the cooling liquid; and wherein: the first volume defines a gas flow domain through which a gas may flow; the first volume is positioned above the second volume, and the drain surface is a bottom surface of the second volume; and when the second sections of the separating member are dissolved by the cooling liquid, open spaces are formed in the separating member and the cooling liquid drains from the first volume into the second volume.

Another innovative aspect of the subject matter described in this specification can be embodied in an apparatus including a first airflow domain, a liquid cooling exchange system located within the first airflow domain that includes a cooling liquid that is circulated within the liquid cooling exchange system; and a second airflow domain that is fluidly separated from the first airflow domain at least in part by a gas seal component, wherein the gas seal component comprises a liquid soluble material that is soluble to the cooling liquid.

Particular embodiments of the subject matter described in this specification can be implemented so as to realize one or more of the following advantages. The liquid soluble air seals/gaskets dissolve when they come into physical contact with coolant, thus allowing for automatic opening of a drain path when the leak occurs. There is no need for an electromechanical switching device, or purely mechanical switching device, to open a drain path; instead, inexpensive and sacrificial sealing material is used to plug the drain path and seal the domain. In the event of a leak, the sacrificial sealing material dissolves, allowing the coolant to drain. The drain locations and drain path may thus be positioned virtually anywhere in the airflow domain, as design factors relating to drain pipes, pumps, etc., are eliminated. Instead, only a hole or space need be created, and then plugged with the sacrificial sealing material, which facilitates multiple drain path design options.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This disclosure describes a liquid soluble gas sealed cooling architecture that provides a fluidly sealed airflow domain with liquid cooling components. The airflow domain is fluidly sealed, in part, by sections that are made of a sacrificial sealing material that is liquid soluble to the coolant used in the liquid cooling components. For example, if water is the coolant, then the sacrificial sealing material is made of a water-soluble material that dissolves when in contact with water (or otherwise structurally fails) to unseal the fluidly sealed domain and provide a drain path for the coolant.

The sacrificial sealing material may be used as one or more of seals, gaskets or plugs. When the sacrificial sealing material is dissolved, liquid is then allowed to flow through the drainage paths and drain from the equipment in a controlled manner. The liquid soluble sealing material thus allows for airflow domains to be fluidly sealed during normal operation but become unsealed in the presence of a coolant leak to allow drainage of the coolant.

These features and additional features are described in more detail below.

Figure 1A:
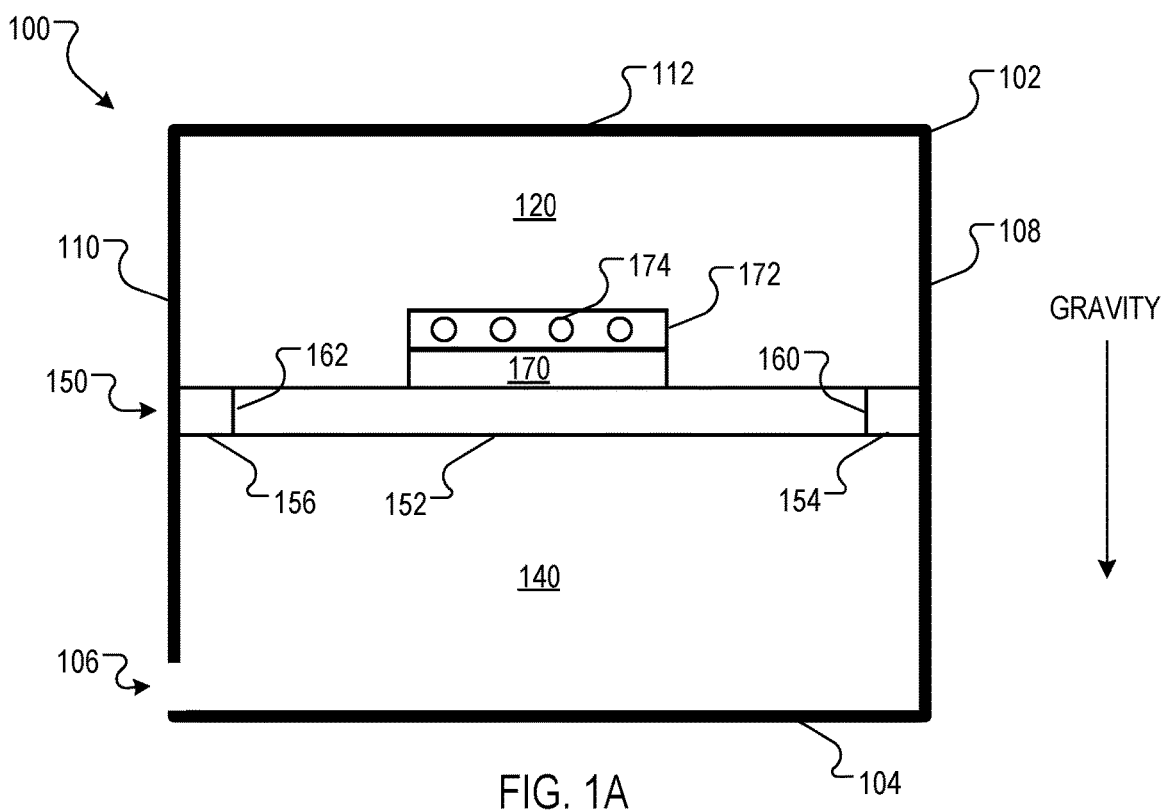
FIGS. 1A and 1B are cross-sectional and top sectional views of an apparatus, such as a server rack, that employs a liquid soluble gas sealed cooling system.
Figure 1B:
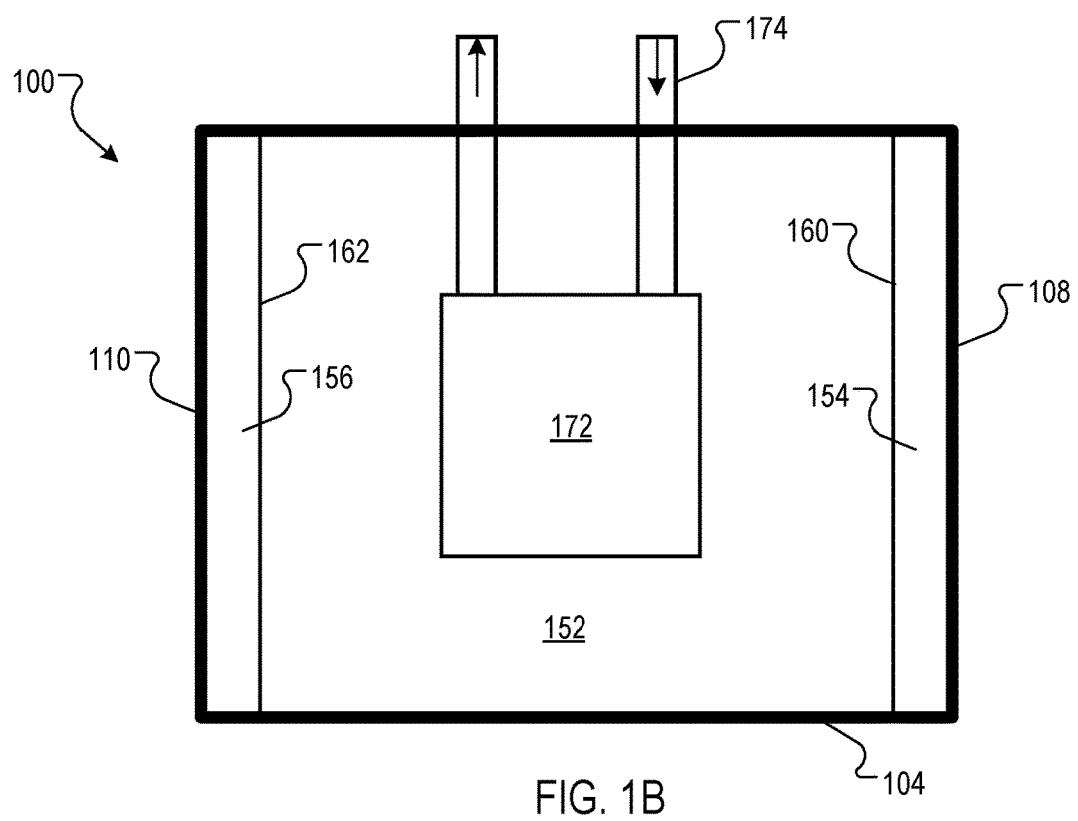

FIGS. 1A and 1B are cross-sectional and top sectional views of an apparatus 100, such as a server rack, that employs a liquid soluble gas sealed cooling system. The apparatus 100 includes a housing 102 having a drain surface 104, i.e., a surface in the downward direction of gravity relative to other components and from which fluid may drain through a drain outlet 106. The drain surface 104 may be a bottom surface upon which the apparatus 100 rests, or, alternatively, may be an intermediate divider below which are additional airflow domains.

The housing 100 includes various walls and structures that define a first volume 120 and a second volume 140. The first volume 120 is positioned above the second volume 140, and the bottom of the second volume 140 is defined by the drain surface 104.

The second volume 140 is fluidly isolated from the first volume 120 by a separating member 150. The separating member 150 includes components that are insoluble to coolant, and components that are soluble to the coolant. In the example implementation of FIGS. 1A and 1B, the separating member 150 includes a first section 152 that is insoluble to the coolant, and one or more second sections, e.g., second sections 154 and 156, that are soluble to the coolant.

The first section 152 may be a printed circuit board that includes electronic components that, when powered, generate a heat load. Alternatively, the first section 152 may be a mounting structure upon which one more circuit boards, fans, or other electronic components may be mounted and powered. In still other implementations, the first section 152 may simply be an interior plate or divider section, and electronic components may be mounted elsewhere within the first volume 120.

The second sections 154 and 156 are gas sealing component that are used to fill a gap that exists between the side edges 160 and 162 of the first section 152 and respective side walls 108 and 110. The second sections are sacrificial sealing material that dissolve when in contact with the coolant. The type of sacrificial sealing material may depend on the coolant used. For example, when water is the coolant, the sacrificial sealing material may be made from a biodegradable plant product, such as material made from grain sorghum or corn starch, the same material that is used to make packing peanuts. Other materials that may be used include polyvinyl alcohol (PVA). More generally, the sacrificial sealing material is any material that dissolves when in contact with the particular coolant used, and when dry provides sufficient striatal integrity at a normal operation temperature (e.g., up to 140 degrees Fahrenheit/60 degrees Celsius) to provide a fluid (gas) isolation at a typical pressure differential between the airflow domains 120 and 140.

The first volume 120 defines a sealed gas flow domain through which a gas may flow. For example, gas in the volume 120 may be maintained at a positive pressure relative to ambient atmospheric pressure. As used in this specification, the term "sealed" does not necessarily mean hermetically sealed or otherwise sealed in a manner that fluid (gas or liquid) may not escape. Instead, the term "sealed" means, in the context of a domain, that a gas may be maintained at a pressure that is higher relative to another domain or an external domain. Thus, the first section 152 and second sections 154 and 156 need not provide a true hermetic seal, but need only provide sufficient isolation to maintain gas flow within the domain.

Figure 1C:
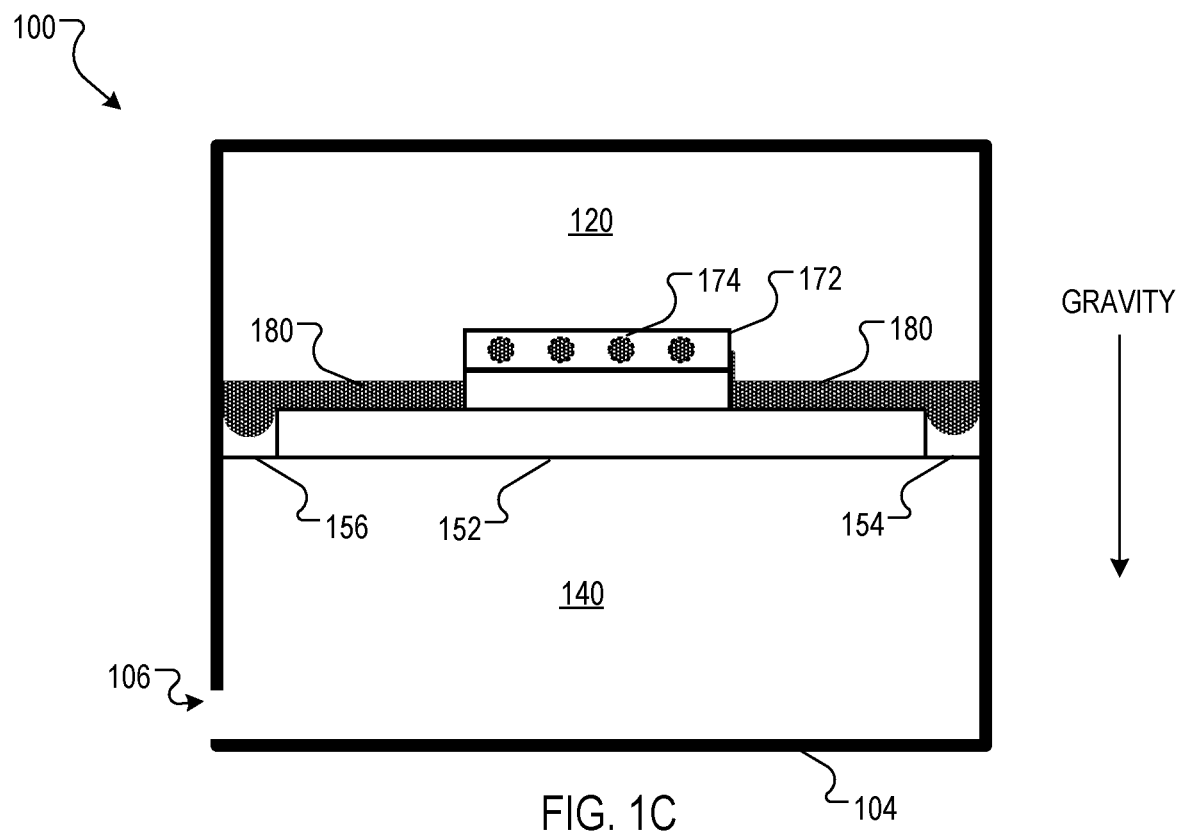
FIG. 1C is a cross-sectional view of the apparatus of FIGS. 1A and 1B, and further illustrating a coolant leak prior to dissolution of sacrificial sealing material.
Figure 1D:
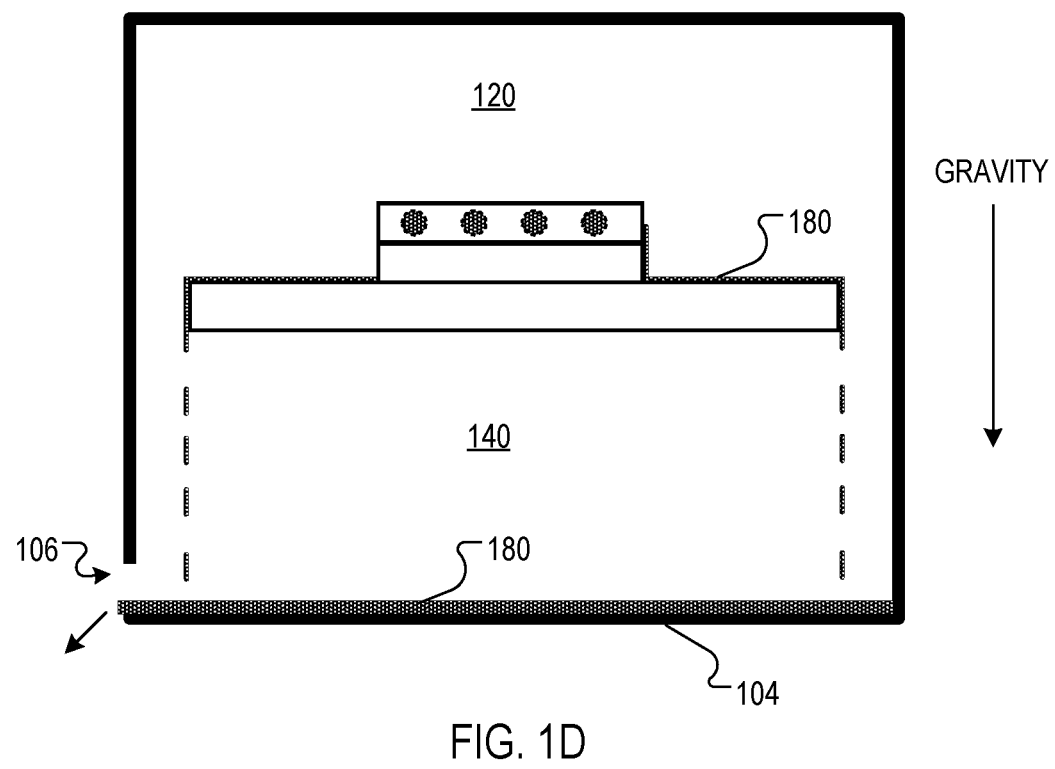
FIG. 1D is a cross-sectional view of the apparatus of FIG. 1C, illustrating a drain path after dissolution of the sacrificial sealing material.

Assuming the first section 152 is a printed circuit board, the first section 152 may be coupled to a heat dissipating component. Within the first volume 140 is a thermal coupler 170 and a cold plate 172. The cold plate 172 is coupled to a tubing 174 though which chilled cooling liquid is circulated. In operation, the electronic components generate a heat load that is cooled by the cooling system by coupling of the heat load through the thermal coupler 170 to the cold plate 172. The first volume 120 and the second volume 140 are fluidly isolated by means of the first section 152 and the second sections 154 and 156. In the event of a coolant leak, however, the second sections 154 and 156 will dissolve to allow for drainage of the coolant. Such a scenario is described with reference to FIGS. 1C and 1D. In particular, FIG. 1C is a cross-sectional view of the apparatus of FIGS. 1A and 1B, and illustrate a coolant leak prior to dissolution of sacrificial sealing material of the second sections 154 and 156. FIG. 1D is the cross-sectional view illustrating a drain path after dissolution of the sacrificial sealing material.

FIG. 1C illustrates a leak occurring at the cold plate 172, and a resultant pooling of coolant 180 in the first volume 120. However, because the coolant 180 is in contact with the second section 154 and 156, and because the second sections 154 and 156 are made of a material that is soluble to the coolant, the second sections 154 and 156 begin to dissolve. Eventually the structural integrity of the sacrificial sealing material fails, and a drain path opens from the first volume 120 to the second volume 140, as shown in FIG. 1D. The drain path is defined by the spaces that connect the first volume 120 to the second volume 140, and created by the dissolution of the sacrificial sealing material. The coolant 180 then collects on the drain surface 104 and drains through the drain outlet 106.

Figure 2A:
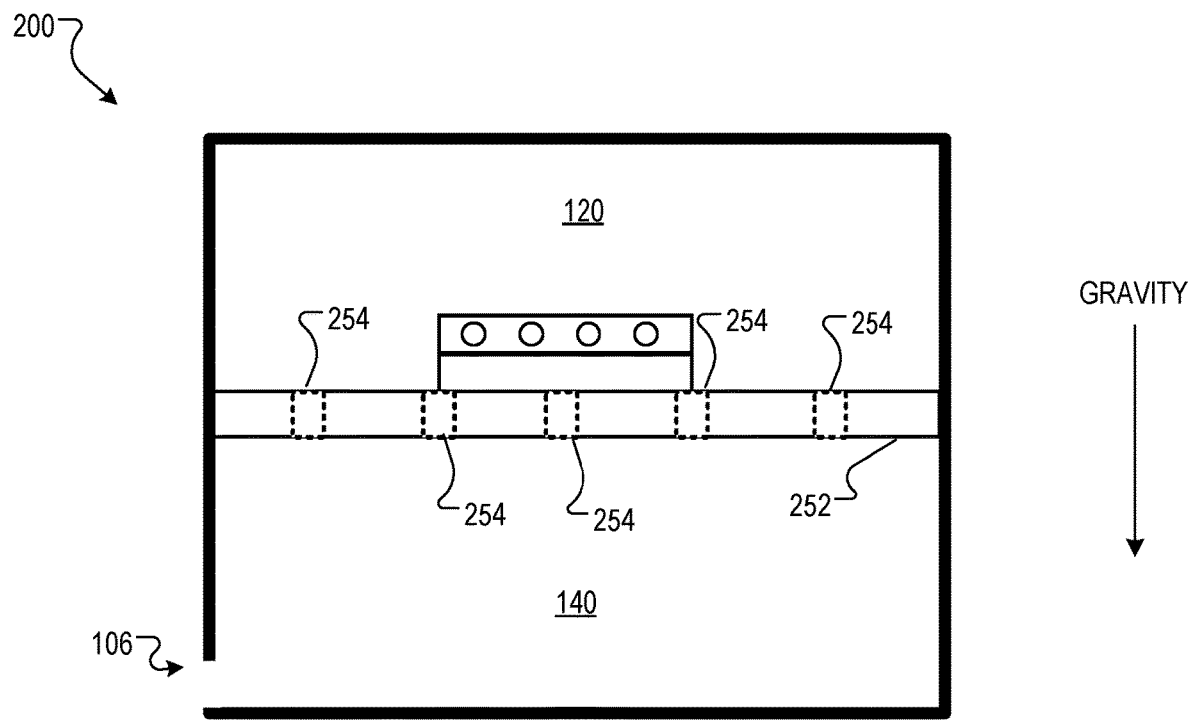
FIGS. 2A and 2B are cross-sectional and top sectional views of an apparatus implementing another implementation of a liquid soluble gas sealed cooling system.
Figure 2B:
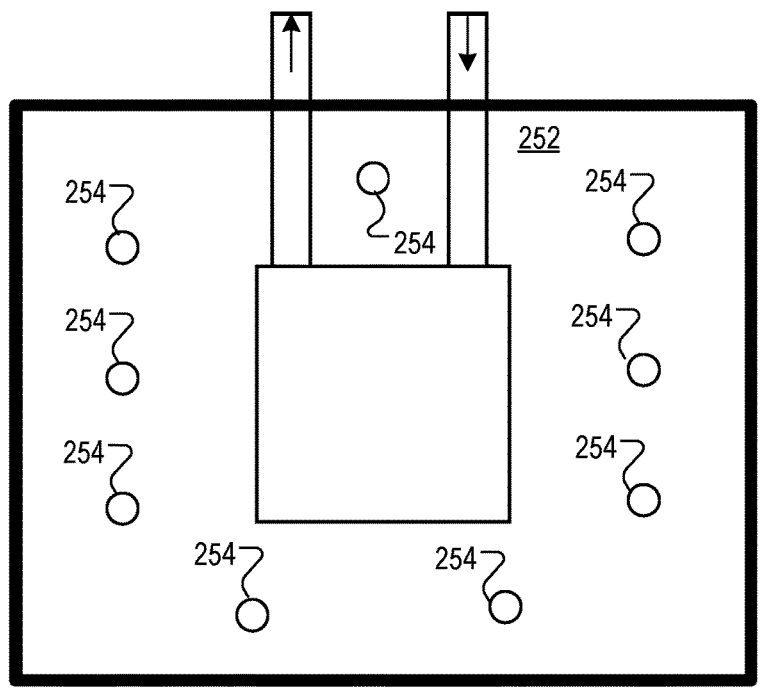

In the example implementation of FIGS. 1A-1D, the first section 152 defines edge peripheries 160 and 162 that are separate from the side walls 108 and 110 of the housing 102. But other configurations can also be used. For example, in FIGS. 2A and 2B, an alternate implementation of the apparatus 200 includes a first section 252 that has multiple holes filled by second sections 254, where each second section is made of the sacrificial sealing material.

Figure 3A:
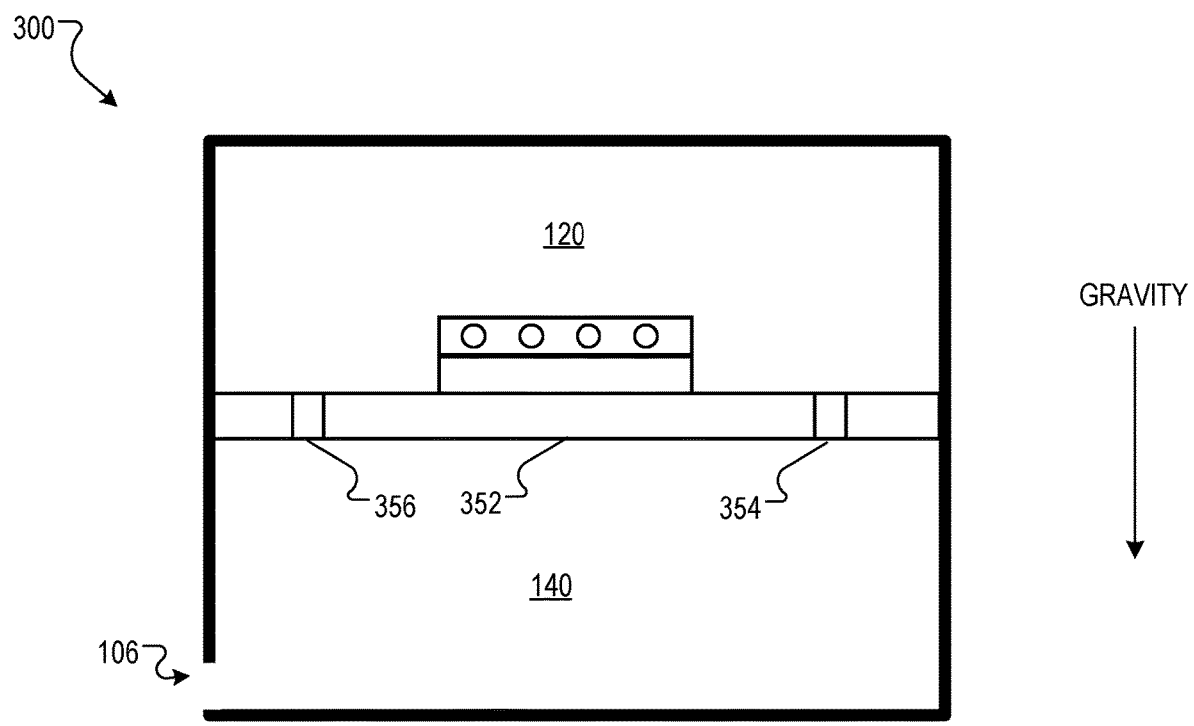
FIGS. 3A and 3B are cross-sectional and top sectional views of an apparatus implementing yet another implementation of a liquid soluble gas sealed cooling system.
Figure 3B:
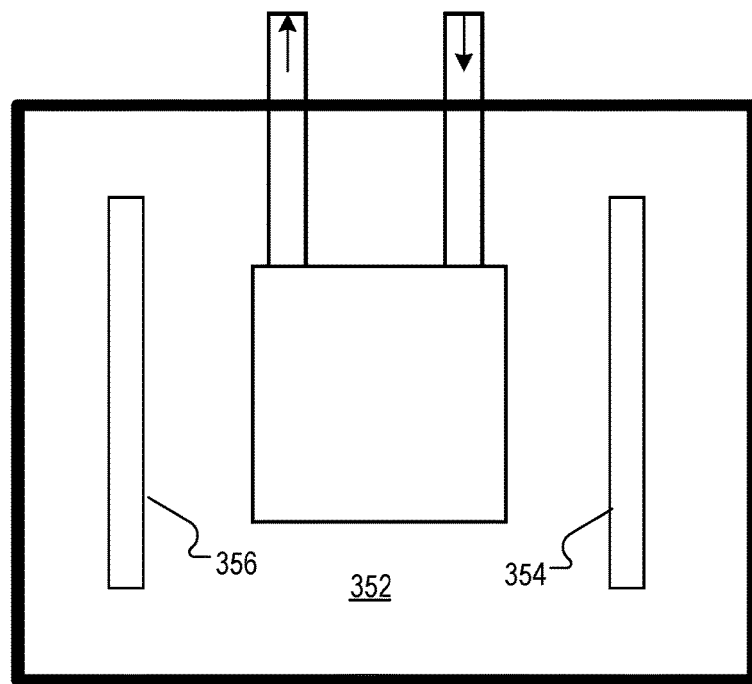

By way of another example, in FIGS. 3A and 3B, an alternate implementation of the apparatus 300 includes a first section 352 and second sections 354 and 356 that fill slots defined in the first section 352. Still other configurations can also be used. For example, instead of multiple gas seal components spaced apart from each other, a single gas seal component can be used to fill a single space in the first section.

While this specification contains many specific implementation details, these should not be construed as limitations on the scope of any features or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A separating member to separate air flow domains in a housing, comprising:
   a first section that is insoluble to a cooling liquid; and
   one or more second sections, wherein each of the one or more second sections is defined by an opening within the first section and is filled with a gas seal component that is soluble to the cooling liquid;
   wherein:
      the separating member is shaped to fit within a housing and when fitted within the housing defines a first air flow domain within the housing and a second air flow domain within the housing, and wherein electronic equipment is located within the first air flow domain;
      when each of the one or more second sections is filled with the gas seal component, the first air flow domain is fluidly isolated from the second air flow domain when the separating member is fitted within the housing; and
      when cooling liquid comes in contact with the gas seal component, the gas seal component dissolves, resulting in the one or more openings causing the first air domain to be in fluid communication with the second air domain.

2. The separating member of claim 1, the first section includes electronic components that, when powered, generate a heat load.

3. The separating member of claim 2, wherein the first section is an electronic circuit board.

4. The separating member of claim 1, wherein the cooling liquid is water, and the second sections are water soluble.

5. The separating member of claim 4, wherein the second sections are made of a biodegradable plant product.

6. The separating member of claim 4, wherein the second sections are made of polyvinyl alcohol (PVA).

7. The separating member of claim 1, wherein:
   the first section defines one or more holes that each penetrate the first section and has an internal periphery; and
   the one or more second sections define plugs that each fill a respective hole in the first section.

8. A separating member to separate air flow domains in a housing, comprising:
   a first section that is insoluble to a cooling liquid; and
   one or more second sections, wherein each of the one or more second sections is defined by a void within the first section and is filled with a gas seal component that is soluble to the cooling liquid;
   wherein:
      the separating member is shaped to fit within a housing and when fitted within the housing defines a first air flow domain within the housing and a second air flow domain within the housing, and wherein electronic equipment is located within the first air flow domain, and the first section defines a periphery that is separate from at least one side wall of the housing when fitted within the housing and the void is the space between the at least one side wall of the housing and the periphery;
      when each of the one or more second sections is filled with the gas seal component, the first air flow domain is fluidly isolated from the second air flow domain when the separating member is fitted within the housing; and
      when cooling liquid comes in contact with the gas seal component, the gas seal component dissolves, resulting in the one or more voids causing the first air domain to be in fluid communication with the second air domain.

9. The separating member of claim 8, the first section includes electronic components that, when powered, generate a heat load.

10. The separating member of claim 9, wherein the first section is an electronic circuit board.

11. The separating member of claim 8, wherein the cooling liquid is water, and the second sections are water soluble.

12. The separating member of claim 11, wherein the second sections are made of a biodegradable plant product.

13. The separating member of claim 11, wherein the second sections are made of polyvinyl alcohol (PVA).

* * * * *